(12) United States Patent
Sogard et al.

(10) Patent No.: US 6,376,329 B1
(45) Date of Patent: *Apr. 23, 2002

(54) SEMICONDUCTOR WAFER ALIGNMENT USING BACKSIDE ILLUMINATION

(75) Inventors: Michael R. Sogard, Menlo Park; John H. McCoy, San Carlos, both of CA (US)

(73) Assignee: Nikon Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/906,190

(22) Filed: Aug. 4, 1997

(51) Int. Cl.$^7$ .............................................. H01L 21/76
(52) U.S. Cl. ....................................... 438/401; 438/462
(58) Field of Search ................................ 438/401, 462, 438/460, 400, 410; 430/22

(56) References Cited

U.S. PATENT DOCUMENTS 4,798,470 A    1/1989   Moriyama et al. ............ 356/401
5,496,699 A  * 3/1996   Pforr et al. ..................... 430/22
5,822,389 A  * 10/1998  Uzawa et al. ................... 430/22

FOREIGN PATENT DOCUMENTS

| JP | 62-160722 | 7/1987 | ........... H01L/21/30 |
| JP | 63-224327 | 9/1988 | ........... H01L/21/30 |
| JP | 4-259249  | 9/1992 | ........... H01L/27/00 |

* cited by examiner

Primary Examiner—Charles Bowers
Assistant Examiner—Craig Thompson
(74) Attorney, Agent, or Firm—Skjerven Morrill MacPherson LLP; Norman R. Klivans

(57) ABSTRACT

A projection exposure apparatus for exposing a semiconductor wafer to a pattern, formed on a reticle, using a projection lens system. An alignment optical system is disposed at a backside of the wafer which is remote from the projection lens system. The alignment optical system detects an alignment mark provided on the frontside of the wafer from the backside of the wafer. Thus the wafer alignment mark is detected without being adversely affected by integrated circuit layers, e.g. photoresist, metallization, etc. applied to the principal surface (frontside) of the wafer, and the reticle and wafer can be aligned accurately. Any tilting or wedging of the wafer, i.e. non-normality to the incident light beam, is detected and corrected for.

13 Claims, 6 Drawing Sheets

SEMICONDUCTOR WAFER ALIGNMENT USING BACKSIDE ILLUMINATION

BACKGROUND OF THE INVENTION

1. Field of the Invention

This invention relates generally to an alignment method and apparatus for aligning an article and more particularly to alignment usable for instance in the fabrication of semiconductor devices such as integrated circuits for aligning a mask having a pattern thereon with a wafer.

2. Description of the Prior Art

Projection exposure apparatuses used in the manufacture of semiconductor devices, for projecting images of a pattern of a reticle upon different portions of the surface of a wafer in sequence by use of a projection lens systems, generally include an alignment system wherein, for aligning the reticle and the wafer prior to the projection exposure, a light is projected from the projection lens system side onto an alignment mark formed on the wafer surface. Such alignment light is diffracted by the features of the wafer alignment mark and the diffracted light is detected by a photoelectric detector, whereby an alignment signal representing the position of the wafer is obtained.

Typical prior art alignment involves topside alignment using a number of sets of marks, e.g. depressions, formed in the top (principal) surface of a wafer. However, problematically later processing steps blur or obliterate these marks and/or cover them up with other semiconductor layers, e.g. polysilicon structures, metallization, oxides, etc. This blurring or covering up typically requires forming new secondary alignment marks in the upper semiconductor layers; however these secondary marks are then typically slightly shifted from the location of the original marks, leading to alignment degradation. Thus the processing operation to form the integrated circuit introduces asymmetries in the mark locations, leading to further systematic shifts of the apparent mark positions as well as reducing the image quality of the marks.

U.S. Pat. No. 4,952,060, issued Aug. 28, 1992 to Ina et al., incorporated herein by reference in its entirety, discloses a backside alignment scheme in which the alignment marks are formed either on the principal surface of the wafer or on the backside of the wafer. In either case, the alignment marks are detected from the backside (lower side) of the wafer. Since this backside typically does not have semiconductor processing performed on it, and the silicon wafer is transparent to certain wavelengths of illumination, the original so-called "virgin" marks formed on the front side of the wafer are always visible from the wafer backside, in spite of subsequent processing steps. Thus the alignment signals are obtainable without being affected by the processing of the principal (frontside) surface of the wafer, and the undesirable deterioration of alignment accuracy is avoided.

Present FIG. 1 (identical to FIG. 1 of Ina et al.) depicts such an apparatus for a step and repeat type reduction projection exposure system. Semiconductor wafer 1 (the workpiece) is held on a wafer chuck 9 mounted on a wafer stage 10. Stage 10 is an XY stage movable in the X and Y directions and driven by a wafer stage driving system 11. Reticle (mask) 4 (the original) has formed on its lower surface a pattern 20 to be transferred to each of the different areas (die) of the wafer 1. Also, alignment marks 21 and 21' to be used for the alignment of the reticle 4 are located on reticle 4. Light sources 3 and 3' provide light for the reticle alignment. A reticle stage 5 holds reticle 4 and is driven by a reticle stage driving system 6 to set the position of the reticle 4 in the X, Y and θ (rotational) directions. Illumination system 7 illuminates reticle 4 since the pattern 20 on the reticle 4 is photoprinted on a resist layer provided on the wafer 1 upper surface. Projections lens system 8 images, on a reduced scale, the pattern 20 and the alignment marks 21 and 21' of the reticle 4 on the wafer 1 upper surface.

When a new reticle 4 is placed on the reticle stage 5, the first step is to align the reticle 4. Without a wafer in place, the illuminators 3 and 3' illuminate the reticle alignment marks 21 and 21'. The projection lens 8 places a reduced image at the plane of the missing wafer. The wafer chuck 9 is provided with throughbores (not shown) formed at positions corresponding to the alignment marks 22 and 22' on the wafer or the images of the reticle alignment marks 21 and 21' projected by the projection lens system 8. Alternatively the wafer chuck 9 is formed of a transparent glass material (quartz) instead of having the throughbores. The relay lens 14 (14') reimages the reticle marks onto the reference plate members 13 and 13'. Thus the alignment detecting system 16 can reference the reticle marks to the wafer reference. The reticle stage is moved to improve the reference. Now the wafer can be aligned to the references 13 and 13' and thus be aligned to the reticle marks 21 and 21'. This is only one of several ways that the reticle marks can be referenced to the wafer.

Light sources 12 and 12' provide light to be used for the alignment of the wafer 1. Reference plate members 13 and 13' each have formed thereon a reference mark 23 or 23' and have been previously aligned to the corresponding one of the reticle alignment marks 21 and 21' for the reticle alignment and for a corresponding one of the wafer alignment marks 22 and 22' for the wafer alignment. Relay lenses 14 and 14' each are movable in the direction of its optical axis. Reference mark 23 (23') is provided for the position which is in the illustrated state, optically conjugate with the surface of the wafer chuck 9 with respect to the relay lens 14 (14').

Alignment optical system 15 includes the above described relay lenses 14 and 14', reference plate members 13 and 13' etc. The alignment optical system 15 is arranged to project the alignment light emitted from the light sources 12 and 12' upon reference marks 23 and 23' respectively, and upon the wafer alignment marks 22 and 22', respectively which are formed on either the front or the rear (backside or lower) surface of the wafer 1 and which are related to the current area to be exposed on the wafer 1. Thus by irradiation of these marks with light supplied from the light sources 12 and 12', optical signals necessary for the wafer alignment are obtained in the form of diffracted or reflected light from the features of these marks.

The alignment optical system 15 detects optical signals concerning the reticle alignment marks 21 and 21' as well as the reference marks 23 to 23' for reticle alignment purposes. Alignment detection system 16 is provided to measure or detect any relative position of deviation between each wafer alignment mark and a corresponding one of the reference marks, or each reticle alignment mark and a corresponding one of the reference marks.

Clearly, it is necessary when the alignment marks are on the top surface of wafer 1 that the light used to illuminate them passes through the wafer 1. Since wafer 1 is typically of silicon, the disclosed light source is a carbon dioxide gas laser producing light of 10.31 microns wavelength.

While this system appears to have utility, it has not been put into commercial practice so far as is known. This may be because of a significant defect called herein wedging or tilting.

Semiconductor wafers are sawn from a cylinder bolus of silicon crystal. Since conventionally all wafer processing steps which require precision are performed on the principal (front) surface of each wafer, only that surface is typically provided to have a precision flat surface. That is, the backside surface may not be in a plane parallel to the frontside but may be slightly out of the plane, thus giving the wafer (in cross section) a slight wedge shape. It is to be understood that this wedge shape is only a slight deviation from the parallel plane. However, even a slight such wedge shape, in combination with the backside imaging described above, results in a significant alignment error as described in detail below.

In addition to the wedge problem, there is also a related tilt problem even when the wafer has two parallel surfaces. Frequently wafers are not held down tightly to the wafer chuck over their entire backside surface, but may be slightly tilted on the chuck due to locally poor chucking. This may be caused by small particles trapped between the wafer and chuck. The chucks used are typically vacuum chucks which depend on a number of perforations therethrough at which a vacuum is provided in order to hold down the wafer. Thus this tilting due to imperfect chucking results in a similar problem as described above, i.e. the backside of the wafer is not in a plane exactly perpendicular to the axis of the incident alignment light.

SUMMARY

In accordance with the present invention, the above-described drawbacks of wafer alignment using backside wafer illumination have been solved. The wedging or tilting problem, in which the wafer backside surface is not normal to the incident alignment light beam, whereby refraction or reflection by the wafer shifts the apparent position of the alignment mark, is solved by using autocollimation from the backside wafer surface with a second beam of e.g. visible light. This allows the wafer tilt to be measured by reflecting the visible light from the backside surface of the wafer, thereby allowing measurement of and correction for the wafer tilting or wedging. Visible light is used in one embodiment to make sure that it is a wavelength both easily reflected from the wafer surface and which will not be detected by the detector which detects the e.g. infrared light diffracted by the alignment mark. Hence a second source of light and a second detector are provided for this autocollimation detection. In one embodiment a quadrant detector is used which measures the centroid of the incident beam of the visible light to high accuracy; hence very small deviations from the normal incidence of the visible light beam may be detected.

Also, in accordance with the present invention two particular XY stage embodiments allow access to the backside of the wafer for alignment purposes.

In addition to wedging, another consideration in using backside alignment of front surface marks is the effect of the wafer on the light which is reflected from it and transmitted through it. Because the index of refraction of silicon (the usual wafer material) is high at infrared wavelengths, approximately 30% of the light is reflected from the wafer backside surface. This will tend to lower image contrast somewhat. Also, the wafer backside surface may be covered by a thin film of silicon dioxide from an earlier process step. The effects of these properties will depend somewhat on the type of alignment detection used and is discussed below.

To some extent, the presence of the silicon wafer between the illumination source and the alignment marks is analogous to the presence of the thin layer (about 1 $\mu$m thick) of resist (photoresist) covering the conventional top surface marks. Misalignment errors will occur there as well if the resist surface is not flat and parallel to the wafer surface.

Alignment systems can be characterized by whether they analyze an image of the mark in an optical plane conjugate to the plane of the mark, or whether they analyze the intensity pattern in the back focal plane of the final lens. The latter represents a Fourier transform of the mark pattern. For the latter case the signal comes from light diffracted by the mark. Since the diffracted light follows a different path than the incident light, multiple reflections within the wafer, as well as light reflected from the wafer back surface, will not interfere with the signal. This type of alignment technique requires an approximately monochromatic light source. Because there is no common path between incident and reflected (diffracted) light, the monochromaticity does not cause a problem. This type of mark detection will suffer if the mark itself is of poor quality. For example, it frequently has problems with alignment marks on metallization layers, where metallic grains several microns in size can cause severe speckle. In this case, there is enough scattered light to create interference with the diffracted light signal. This should not be a problem for backside alignment, since the zero level marks can be made to high quality without compromising any processing steps.

In the former case, incident and reflected light follow common paths, so interference can occur which can degrade the image. This can be avoided by increasing the bandwidth of the radiation, so that the coherence length of the light is less than the optical thickness of the wafer. This type of alignment would probably not be possible with the monochromatic source specified by Ina et al.

Reflections and scattered light from the backside surface of the wafer are another consideration. The silicon dioxide layer is an unintentional side product of various process steps, and its properties and homogeneity are not controlled. Degradation of the signal from these effects can be minimized by choosing the depth of focus of the imaging (projection) lens to be shorter than the wafer thickness. The back surface of the wafer will then be out of focus and will contribute little to the pattern structure.

In general, it may be expected that some combination of frontside (top surface) and backside alignment will be used. Therefore, calibration of the two types of alignment systems must be considered. This can be done using a special calibration mark or marks (fiducial marks) mounted on the wafer stage rather than marks on the wafer itself. These marks are on e.g. silicon plates of thickness comparable to a wafer and which are accessible from the backside, so that frontside and backside alignment can be carried out on the same high quality mark. The silicon plate has parallel surfaces and is aligned normal to the optical axis of the projection lens, so no offset error exists between the two alignment systems. The sensitivity of the backside alignment system to detecting wedging error can be calibrated by including patterns on plates with a controlled amount of wedge, or by tilting the stage using a separate actuator; such actuators are common on lithography machines.

DETAILED DESCRIPTION

Figure 2A:
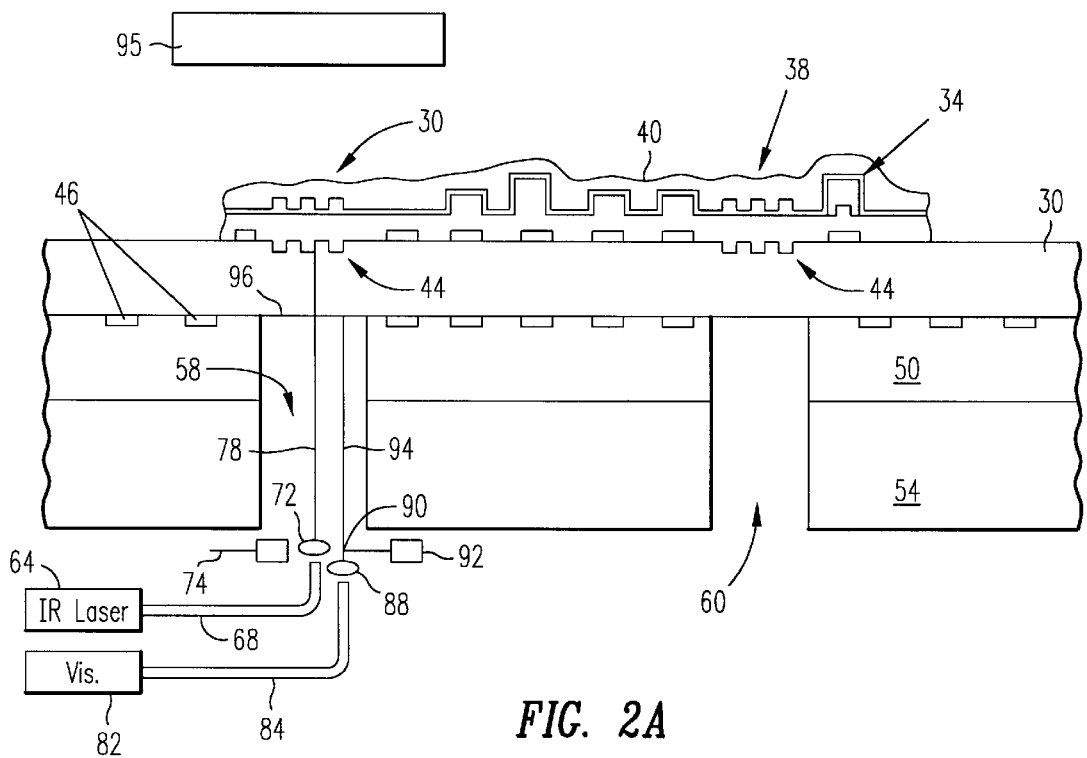
FIG. 2A shows, in accordance with the present invention, the combination of backside illumination of the alignment marks with a second illumination of the backside surface of the wafer to detect wafer wedging or tilting.

FIG. 2A shows in cross section a portion of an apparatus for measuring the tilt/wedging of a wafer to deal with the above-described situation in which the backside surface of the wafer is not normal to the axis of the incident light beam used to determine the location of an alignment mark on the wafer. In FIG. 2A the semiconductor wafer 30 (e.g. of silicon) has formed on its frontside (principal) surface conventional integrated circuit structures formed in layers. These structures as illustrated include layers e.g. of oxide, metal, polycrystalline silicon 34 and photoresist 40. In some of these layers secondary alignment marks 38 are formed. These secondary alignment marks 38 are intended to be vertically aligned with the original alignment marks 44 formed in the surface of the original (virgin) wafer 30. However, as described above, frequently the secondary alignment marks 38 are not properly aligned with the original alignment marks 44 and it is desirable to use the original alignment marks 44 for purposes of alignment, as described above.

Wafer 30 is conventionally held on a wafer chuck 50 by vacuum ports 46. Wafer chuck 50 is conventionally mounted on an XY stage 54 (details of several embodiments of this stage are provided below).

Several throughbores e.g. 58 and 60 are provided through chuck 50 and stage 54, as described above. These throughbores 58, 60 allow access to the alignment marks 44 from the backside surface of the wafer i.e. from below the stage 54 in the figure.

Thus a laser or other suitable light source 64 (in this case an infrared diode laser source) provides, via optical fiber 68, suitable light which is projected through lens 72 as a light beam 78 onto the alignment marks 44. This portion of the apparatus is as described above. The infrared light which is diffracted reflectively from alignment marks 44 is captured by a detector 74 and processed conventionally.

In one embodiment the technique for detecting the alignment marks 44 is what is called commercially by Nikon Corporation "LSA" (laser scanning alignment). This is an example of one way to perform this function (which usually requires a narrow band illumination source). Briefly, in the laser scanning alignment the focused beam 78 from laser source 64 is incident upon alignment marks 44. Stage 54 is translated a small amount back and forth, i.e. to the left and right in FIG. 2A. The laser beam 78 thereby scans the alignment marks and the detector 74 detects changes in the diffracted laser signal as the marks 44 pass through the laser beam. Note that the alignment marks, which are only partially depicted in FIG. 2A, are conventionally an array of squares, 4×4 $\mu m^2$ separated by 4 $\mu m$. The laser beam is narrow in the scanning direction, but in the orthogonal direction it is as wide as the alignment mark array.

In accordance with the invention a second light source 82, in this case a visible light source, for instance a laser diode or light-emitting diode provides, via a second optical fiber 84 to a second lens 88 and through partially transmissive mirror 90, a light beam 94 which is incident upon the backside (lower) surface 96 of wafer 30. The purpose of light beam 94 is to measure the wedging or tilting of the wafer 30. The light beam 94 which is incident upon the backside surface 96 of reticle 30 is reflected back from mirror 90 to a quadrant detector 92.

Provided in some embodiments (and not shown here) mounted at a suitable location on stage 54 is a reflective surface (mirror) which at certain locations of stage 54 relative to light beam 94 receives incident light beam 94 and reflects it back to mirror 90 and thence to detector 92. This additional mirror allows calibration of the autocollimator since the additional mirror is level with regard to the principal surface of chuck 50.

This additional mirror is calibrated against the tilt of stage 54. Note that typically there are a number, for instance 6 to 12, of sets of alignment marks 44 on any one wafer at scattered locations on the wafer surface. Therefore it is necessary to provide appropriate throughholes or otherwise transmissive portions at appropriate locations through the stage 54 and chuck 50 to accommodate light beams which will be incident upon these alignment marks. Thus in one embodiment the light sources, focussing devices and detectors are stationary and the stage 54 is translated so as to align the boreholes 58, 60 (and others not shown) to line up with the light beams.

Figure 1:
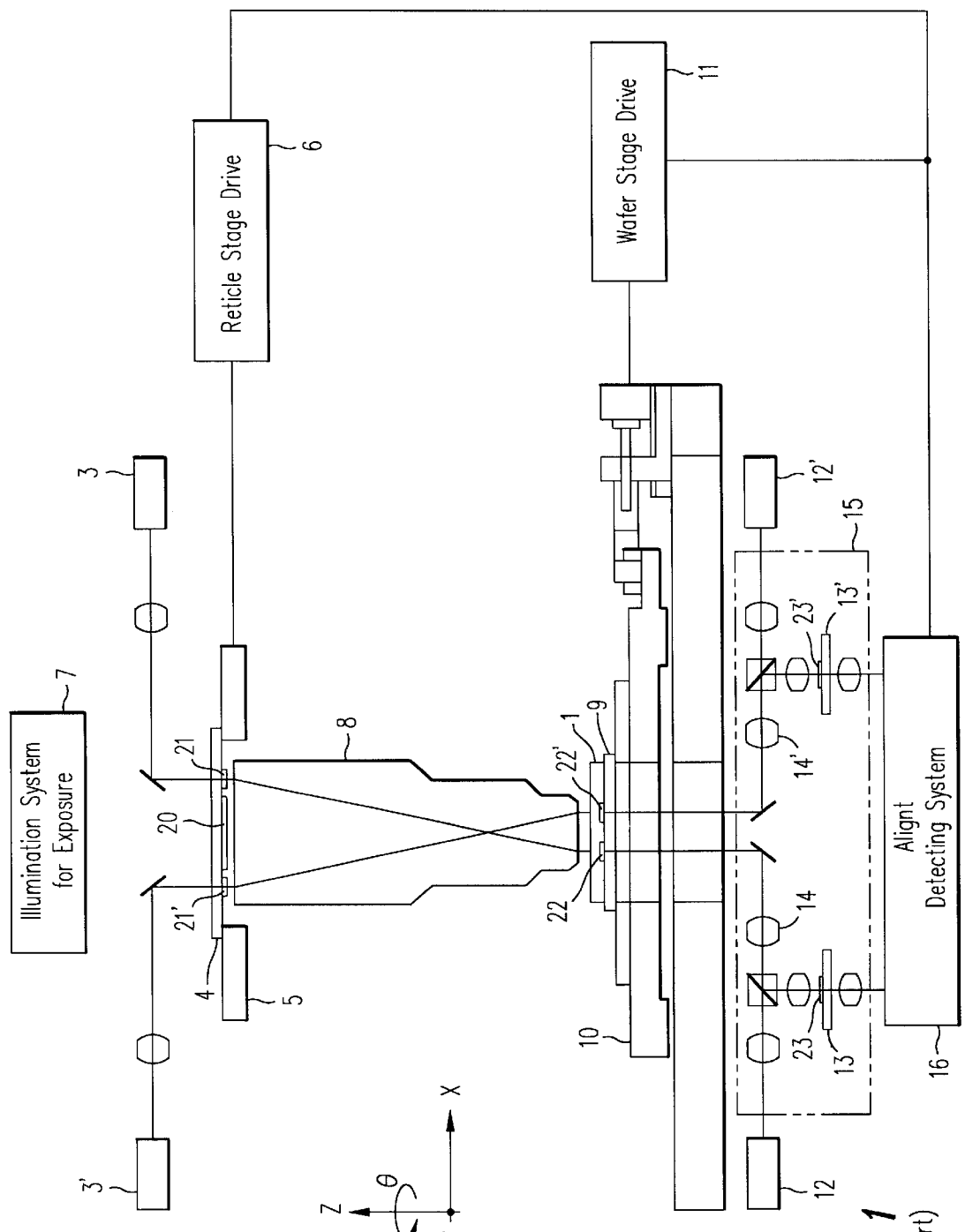
FIG. 1 shows the prior art alignment method using backside illumination of the wafer.

It is to be appreciated that much of the structure of prior art FIG. 1 is not shown in FIG. 2A but would be present, including of course the reticle, reticle chuck, reticle stage, light sources, reticle stage drive and wafer stage drive, and the actual alignment detecting system electronics. Also, the optics of the type shown in FIG. 1, which are more complex than those of FIG. 2A, may be used in the context of FIG. 2A.

Figure 2B:
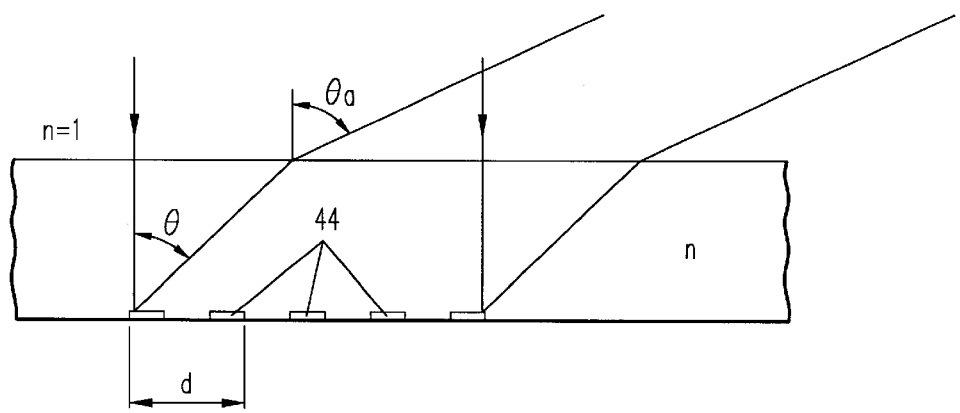
FIG. 2B shows backside alignment using laser scanning alignment.

While the LSA technique could be used for backside alignment, some changes in the optics are required. In addition to adjusting lens coatings and optical powers to compensate for the different wavelength, the numerical apertures and diffraction angles of the laser light need to be adjusted for the high index of refraction of silicon. As FIG. 2B illustrates, the diffraction angle of light diffracted from an array of alignment marks 44 depends on the refractive index of the medium through which the light passes. (Note that FIG. 2B is inverted, for ease of understanding, relative to FIG. 2A.) For first order diffraction the angle is determined from the relation $$\sin\theta = \lambda/nd,$$

where $\lambda$ is the wavelength of light, d is the spacing of the alignment marks, and n is the refractive index of the medium.

For resist as the medium, n≈1.3–1.5 typically. Thus for an alignment mark spacing of e.g. 4 $\mu m$ (having a period of 8 $\mu m$) and laser light of wavelength 0.633 $\mu m$ (from a HeNe laser), the angle $\theta$ is about 3.5°. From Snell's law, the angle in air $\theta_a$ above the resist is determined from $\sin\theta_a = n \sin\theta$, leading to $\theta_a = 4.5°$ approximately for n=1.3.

For the case of backside surface alignment, e.g. n (for a silicon wafer)=3.5 and $\lambda$=1.3 $\mu m$. For the same alignment mark spacing, $\theta \approx 2.7°$ and $\theta_a = 9.4°$. Thus the optics of the LSA system are such as to accommodate the different conditions for backside surface alignment.

Figure 3A:
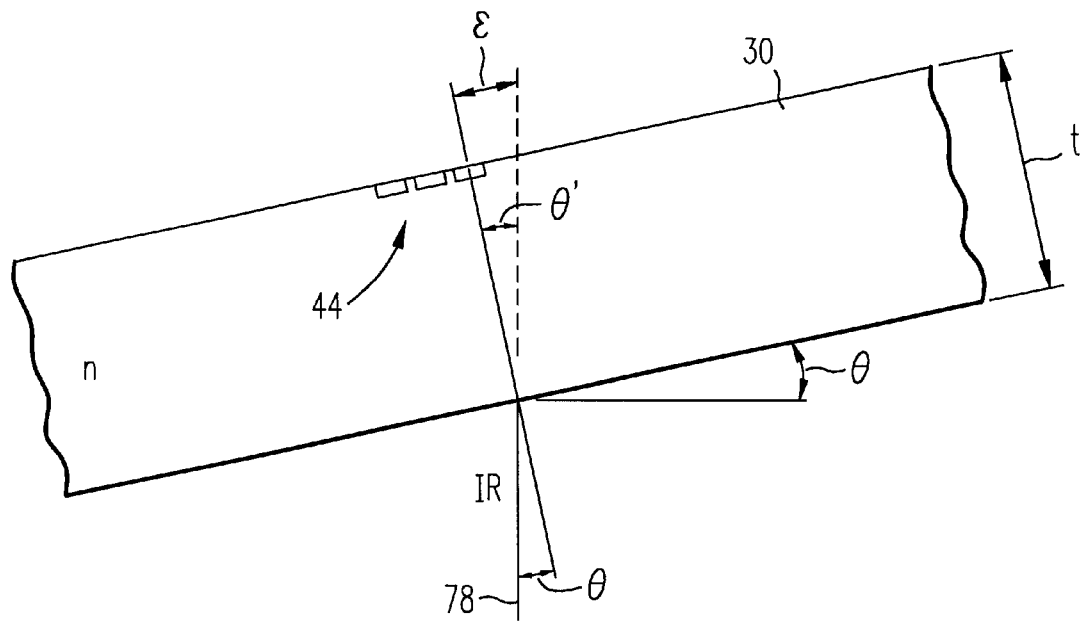
FIG. 3A illustrates diagrammatically the problem of wafer wedging or tilting.

FIG. 3A depicts diagrammatically the alignment error caused by uncorrected wafer tilting or wedging. In FIG. 3A wafer 30 is tilted by an angle θ from the horizontal plane. Wafer 30 has an index of refraction here of n. The incident infrared beam 78 of FIG. 2A is shown. Wafer 30 has a thickness of t. The incident infrared light beam 78 is refracted as it passes through the thickness of wafer 30 by an angle θ' due to the index of refraction, where θ'=θ/n. Thus from the silicon material's geometry the error distance E=t (θ−θ') =t θ (1−1/n) for small angles. If the wavelength of the infrared beam 78 is approximately 1.3 μm for example, and n=3.5 (for silicon), then the error E=0.714 t θ.

As is well known, for a typical 8 inch diameter semiconductor wafer the thickness t is 725 ±20 micrometers. Thus the following table shows for various angles θ the resulting alignment error E in nanometers:

TABLE

| θ | E |
|---|---|
| 1 μrad | 0.52 nm |
| 2 | 1.0 |
| 10 | 5.2 |
| 100 | 52 |

As can be seen for fairly small amounts of wafer tilt (measured in microradians) the error E quickly becomes significant.

Figure 3B:
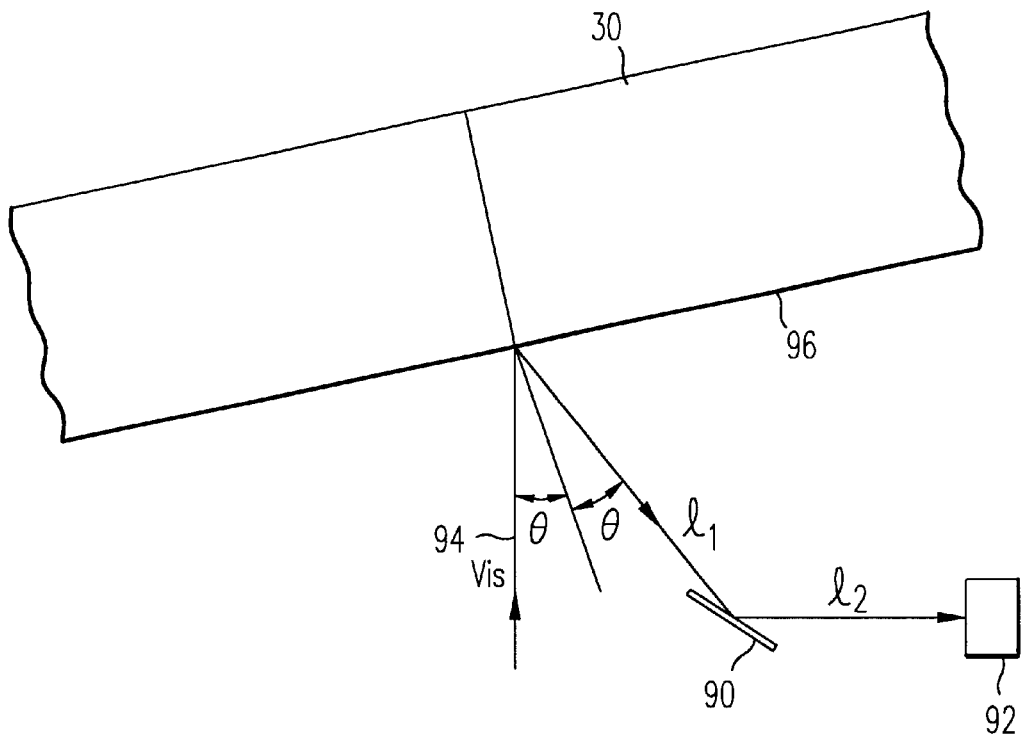
FIG. 3B illustrates diagrammatically in accordance with the present invention determining the amount of wafer wedging or tilting using autocollimation.

FIG. 3B illustrates geometrically the present solution (which is a calculated correction) for this wafer tilting/wedging problem using the apparatus of FIG. 2A. In this case for the wafer 30 the surface of interest is its backside surface 96 onto which visible light beam 94 is incident and reflected. In this case due to the wafer surface 96 being tilted from the horizontal (as defined by being normal to the incident beam 94), the angle of incidence is θ and the angle of reflection also is θ. The reflected beam traverses a distance $l_1$ to be reflected from the surface of the mirror 90 and then a second distance $l_2$ to be received by the quadrant detector 92. This quadrant detector thereby detects displacement of the beam. The beam displacement at detector 92 is designated X.

Thus by simple geometry X=($l_1$+$l_2$) 2 θ.

Thus θ=X/(2($l_1$+$l_2$)).

From before, X=2($l_1$+$l_2$) E/0.714t=2.80($l_1$+$l_2$) E/t.

If $l_1$+$l_2$ is approximately 5 centimeters (as in a typical layout of such a system), then $$X=2.80 \cdot 5E/725 \cdot 10^{-4}=193E$$

Thus an error of E=1 nanometer corresponds to a displacement distance X=0.19 μm. This distance X is easily measured by a commercially available quadrant detector 92. This approach is an autocollimation approach since what is measured is the displacement X and angle θ is inferred from it. Then E is determined from θ. It is to be understood that the detector 92, as described above, is calibrated by observing the beam 94 as reflected from an alignment mirror or calibration mark mounted on a portion of stage 54 known to be horizontal.

Note that this wedging/tilting is a problem only when the wafer alignment marks are located in the frontside surface of the wafer. When one is aligning to alignment marks formed in the backside surface, none of beam 78 passes through the wafer and hence there is no refraction due to the wafer thickness and no error due to wafer refraction. However, any wafer tilt from the direction normal to the incident imaging beam will cause a misalignment between front and back alignment marks.

As indicated above, the angle θ of wafer tilting is not necessarily due to wafer surface imperfections but may also be caused by imperfect chucking. Hence the present method and apparatus have utility even for perfectly flat wafers.

It is to be understood that a processor (not shown) is connected to receive the output signals of both detectors 74 and 92 to perform the computations as shown herein. For instance this alignment detecting system may include a microprocessor executing a computer program which carries out the mathematical steps described herein using as input data the output signals of detectors 74 and 92. Coding such a computer program is well within the skill of one of ordinary skill in the art in light of this disclosure.

For alignment detectors detecting the image of the mark, another drawback in the prior art backside alignment techniques, as described above, is the coherence effects of a light beam transmitted through the thickness of the wafer for detection of the frontside alignment marks from the backside of the wafer. That is to say, a significant portion of the incident light beam 78 is reflected from the backside surface 96 of the wafer and is reflected back to detector 74, causing undesirable interference effects with the intended receiver signal which is the light diffracted from the alignment marks 44. As stated above, the present inventors have determined that this interference can be prevented, by instead of using a monochromatic (single wavelength) i.e. coherent light beam 78, using a somewhat broader (broadband) light source having a bandwidth of δλ and a central wavelength of λ. In this case the coherence length in the wafer is known to be $n\lambda^2/\delta\lambda$. If we require that $n\lambda^2/\delta\lambda$ is less than the thickness t of the wafer, then δλ is greater than $n\lambda^2/t$.

Note that the amount of reflected light can be computed for silicon where reflectivity R=((n−1)/(n+1))²=(2.5/4.5)²= 0.31, i.e. a reflectivity of 31%. For resist with n=1.3, the corresponding reflectivity is only 0.017.

For the case where the central wavelength of the bandwidth is chosen to be 1.3 micrometers, which is a typical infrared wavelength output by commercially available laser diodes, then δλ is approximately 3.5 $(1.3\times10^{-4})^2/(725\times10^{-4})$=8.1 nanometers. Thus a minimum bandwidth of infrared light of 8 nanometers is needed, and preferably somewhat greater. For this broad band an infrared light emitting diode, rather than a diode laser, would be used. Of course this bandwidth is dependent upon the central wavelength, the thickness of the wafer and the index of refraction of the wafer material. Hence this calculation is merely exemplary. Thus by use of a broadband rather than a single wavelength, for illumination of the alignment marks, one can effectively eliminate the undesirable interference effects and increase the strength of the signal received by detector 74.

Note that a broadband illumination source with sufficient bandwidth to extend below the wavelength where silicon starts to absorb strongly (approximately 1.07 μm) could be used for both imaging and autocollimation functions. In this case, a filter would be placed over the auto-collimation detector to remove light with wavelengths for which silicon is transparent, as well as over the reflected/diffracted light detector, to remove light reflected from the wafer's back surface.

The following discloses particular embodiments of stages for carrying out wafer alignment using backside illumination.

It is to be appreciated that the provision of multiple throughholes in a stage may be problematic due to problems of design and fabrication. In this sense, the above-described Ina et al. disclosure does not address these problems except for making it clear that throughbores must be provided both in the stage and wafer chuck. As pointed out by Ina et al., these throughbores need not be voids, but may be transparent structures (windows) transparent to the incident illumination.

In recent years, lithography stages have frequently been designed to be planar, i.e. the moving stage is a single moving plate. Introducing throughholes into such a design is relatively straight forward. However, earlier stage designs were "stacked", where the moving stage consisted of typically two plates, stacked on top one another, with one plate moving in the X direction and the other moving in the Y direction. Providing throughholes through both plates is a much more difficult problem.

Figure 4:
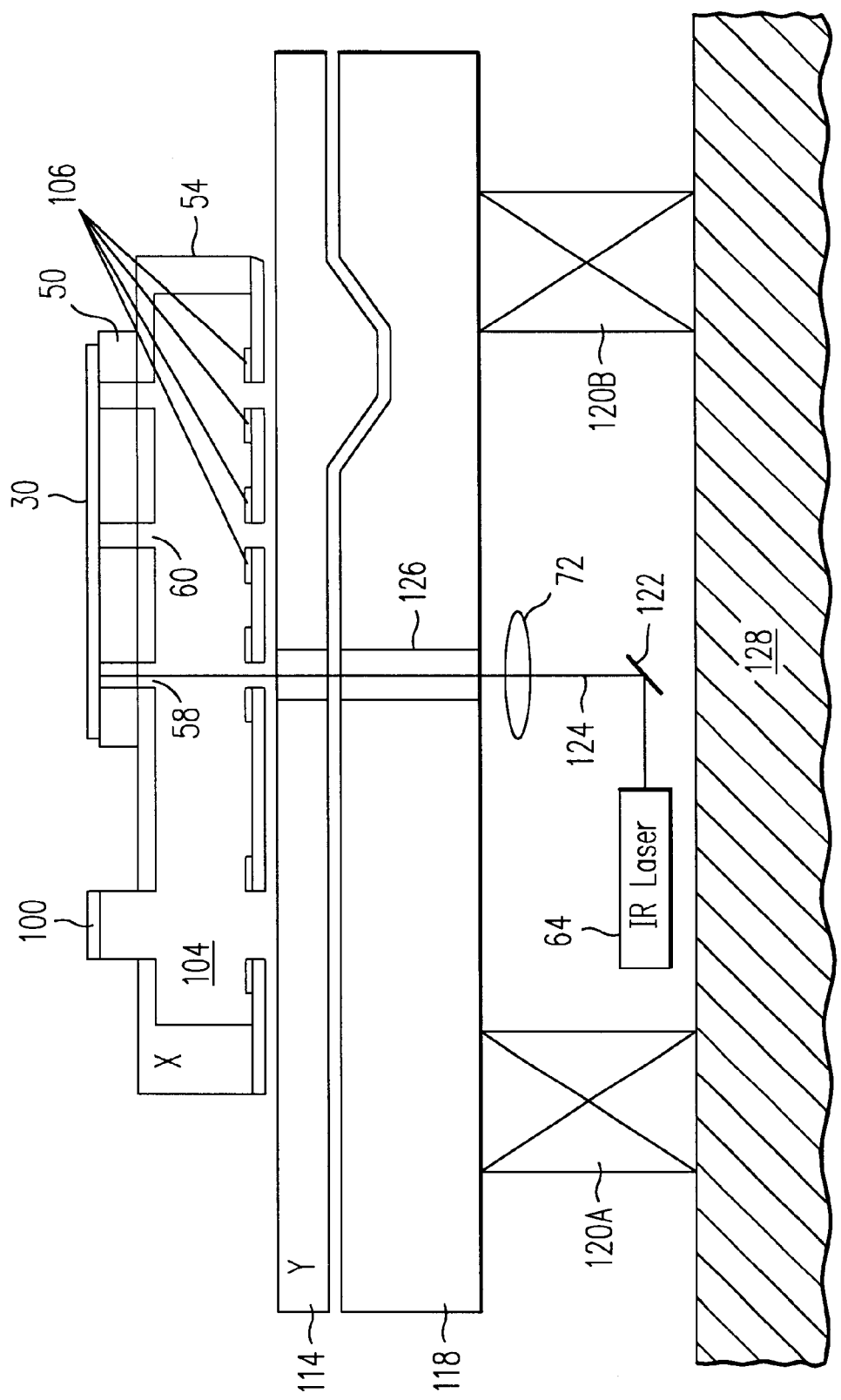
FIG. 4 shows a first wafer XY stage in accordance with the present invention.

FIG. 4 thus depicts one embodiment of a stacked stage and related structures in accordance with the present invention and suitable for use (with the below-described modifications) with the apparatus of FIG. 2A. The elements in FIG. 4 having identical reference numbers to those of FIG. 2A are intended to be identical or similar. FIG. 4 shows more of the structure than does FIG. 2A, including not only the wafer chuck 50 which holds the wafer 30 and the upper stage 54 which here is the X direction stage, but also the underlying Y direction stage 114. In this stacked stage, the X direction stage 54 is located on top of and moves relative to the Y direction stage 114 which in turn sits on a stage base 118. The laser source 64, here, rather than using fiber optics, provides a beam 124 which is reflected by mirror 122 through lens 72 into throughbore 126 through the Y stage 114 and the stage base 118 up into the bore 58 in the X stage 54. A conventional stage fiducial mark 100 is provided on the X stage 54. Here the detectors 106, rather than being fixed relative to the moving X stage 54, are located inside and mounted on a lower surface of X stage 54. Multiple detectors are provided, one surrounding each throughbore 58 and 60 at the lower surface of X stage 54.

Also, depicted for completeness are stage base supports 120A and 120B which in turn rest on foundation 128. It is of course to be understood that this is a simplified depiction of these conventional structures.

Figure 5A:
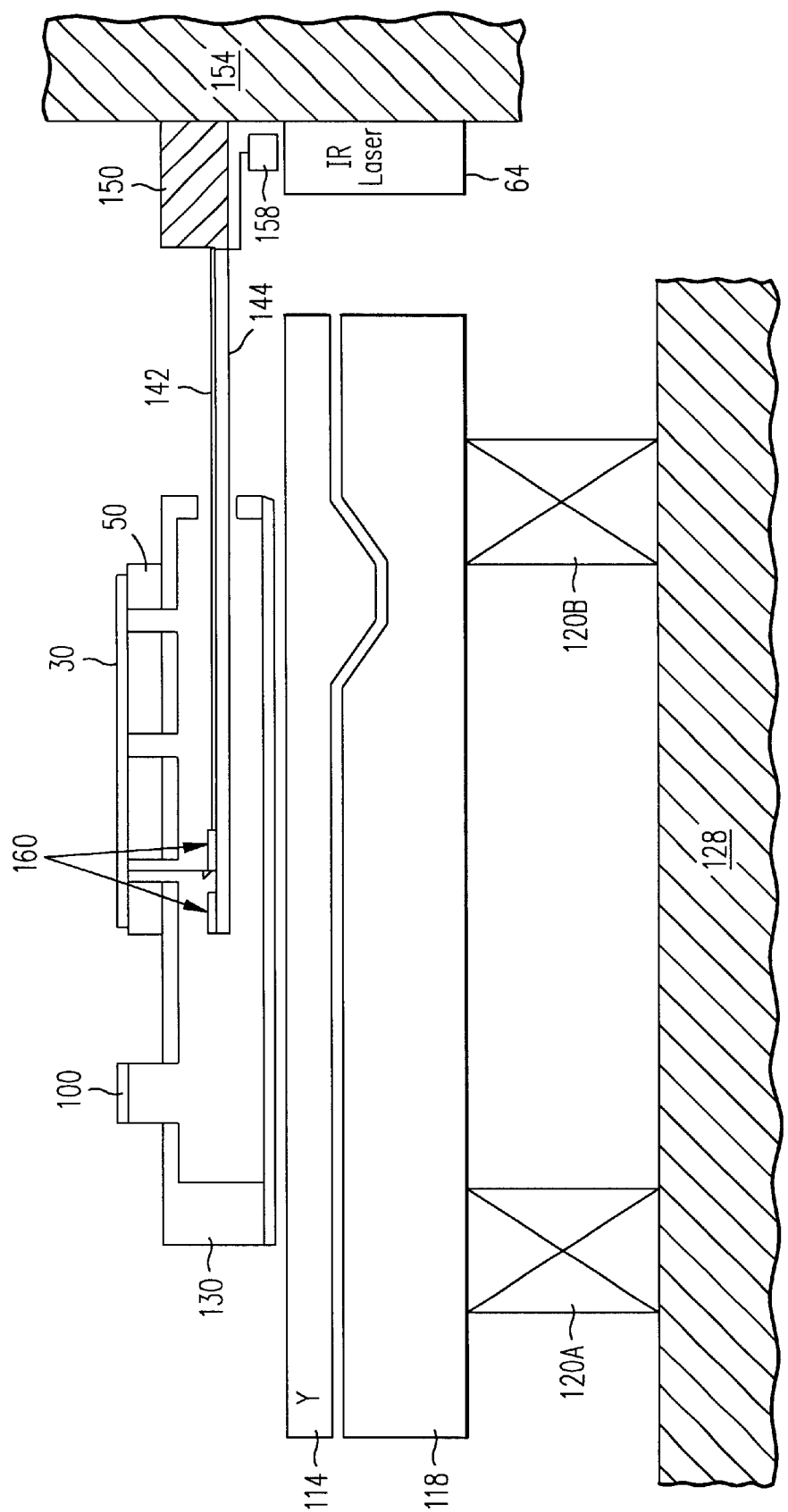
FIGS. 5A and 5B show respectively a side view and a plan view of a second wafer XY stage in accordance with the present invention.
Figure 5B:
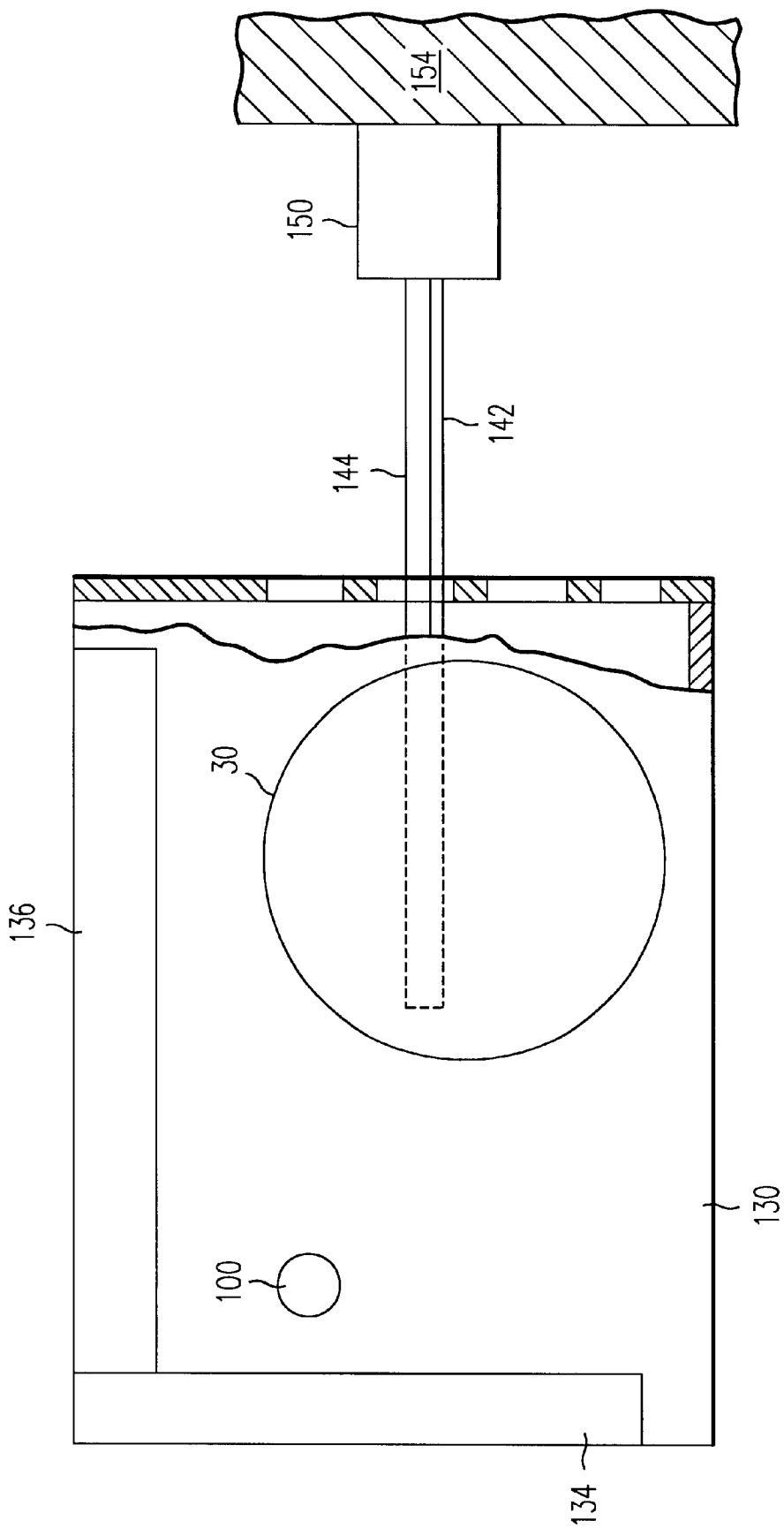

FIGS. 5A and 5B show respectively a plan view and a side view of a second embodiment of a stacked stage structure in accordance with this invention and also suitable for use with the apparatus of FIG. 2A. Again, structures having similar reference numbers to those of other figures are intended to be similar or identical structures. The side view of FIG. 5A corresponds to that of FIG. 4. The difference here is that the detector 160 is mounted on the upper surface of a boom (horizontal member) 144. Boom 144 also carries electrical wires (not shown) connecting the detector 160 to the alignment detection processor (not shown). The boom 144 also carries an optical fiber 142 which connects via housing 150 and connector 158 to the laser 64. Hence the boom 144 carries both the outgoing infrared light signals as well as the received detection electrical signals. The boom 144 is connected via the housing 150 to a vertical support 154. In this case the X stage is referred to by reference number 130 to distinguish it from the somewhat different X stage of FIG. 4.

It is to be understood that in FIG. 4 and also in FIGS. 5A and 5B the visible light system used to measure wafer wedging or tilting is not depicted but would be arranged similar to the depicted infrared light system.

A better idea of the structure of FIG. 5A is obtained by referring to FIG. 5B which is a plan view of the X stage 130 also showing conventional stage interferometer mirrors 134 and 136 with the wafer 30 held on a wafer chuck (not shown). FIG. 5B shows the boom 144 extending underneath the location of wafer 30 through one of several side apertures provided in the right hand side of stage 130. Thus, for instance the boom 144 is fixed and the stage 130 is translated left and right and up and down (in the drawing) allowing access to any point underneath wafer 30 by the boom 144 and the associated sensors and light beams. In one modification the boom 144 instead is a telescopic boom which by itself extends and retracts to the appropriate location.

Of course other arrangements are available. Furthermore, there are currently available non-stacked XY stages which instead are a single XY stage which moves in two dimensions. In this case provision of the requisite throughholes is relatively simple by providing holes or transparent portions both in the stage and associated wafer chuck as described above. Such a structure would be as depicted in FIG. 2A where the stage 54 refers not to merely an X stage but to an XY stage.

This disclosure is illustrative and not limiting. Further modifications will be apparent to one skilled in the art in light of this disclosure and are intended to fall within the scope of the appended claims.

What is claimed:

1. A method for relatively aligning an original and a workpiece in a projection exposure system for projecting a pattern of the original upon a surface of the workpiece by a projection optical system, the method comprising the steps of:

determining an alignment between an alignment mark on the original and an alignment mark associated with the workpiece;

determining an amount of tilt of a backside surface of the workpiece opposite the projection optical system; and aligning the original and the workpiece on the basis of the alignment, corrected for the determined amount of tilt of the backside surface of the workpiece.

2. The method of claim 1, wherein the step of determining an amount of tilt comprises the steps of:

directing light incident onto the backside surface of the workpiece;

detecting the incident light reflected from the backside surface of the workpiece; and comparing an angle of the detected light to a nominal angle.

3. The method of claim 1, wherein the step of determining an amount of tilt comprises the steps of:

collimating light incident onto the backside surface of the workpiece; and determining the amount of tilt from a displacement of the collimated light from a predetermined position.

4. The method of claim 1, wherein the alignment mark associated with the workpiece is located on the side thereof facing the projection optical system.

5. The method of claim 1, wherein the alignment mark associated with the workpiece is located on the backside surface thereof.

6. The method of claim 3, wherein the step of determining an amount of tilt comprises the step of determining the amount of tilt to be proportional to the displacement of the collimated light.

7. The method of claim 2, wherein the amount of tilt is an angle between a plane defined by the backside surface of the workpiece and an axis defined by a path of the incident light.

8. The method of claim 2, further comprising the steps of:
   placing the workpiece on a support; and
   directing the incident light through a transmissive portion of the support.

9. The method of claim 2, wherein a wavelength of the incident light differs from a wavelength of light used in the step of determining an alignment.

10. The method of claim 1, wherein the step of determining an alignment comprises the steps of:
   directing radiation incident onto a location of the workpiece; and
   detecting the incident radiation propagated from the location of the workpiece.

11. The method of claim 10, wherein the step of determining an alignment comprises the step of imaging the alignment mark associated with the workpiece from a frontside of the workpiece location.

12. The method of claim 1, wherein the step of determining an alignment comprises:
   forming an image of an alignment mark on the original through the projection optical system;
   detecting the image formed of the alignment mark; and
   detecting an alignment mark associated with the workpiece, from a backside of a location of the workpiece opposite the projection optical system.

13. A method for relatively aligning an original and a wafer in a projection exposure system for projecting a pattern of the original upon a surface of the wafer by a projection optical system, the method comprising the steps of:
   forming an image of an alignment mark on the original through the projection optical system;
   detecting the image of the alignment mark on the original;
   illuminating an alignment mark provided on a surface of the wafer nearest the original, the illumination being from a side of the wafer remote from the original;
   detecting illumination diffracted from the alignment mark on the wafer, the detecting being from the side of the silicon wafer remote from the original; and
   relatively aligning the original and the wafer on the basis of the detected illumination and the detected image of the alignment mark on the original.

* * * * *